United States Patent [19]
Truscott

[11] Patent Number: 5,606,175
[45] Date of Patent: Feb. 25, 1997

[54] MULTIPLE QUANTUM WELL DEVICE

[75] Inventor: William S. Truscott, Manchester, United Kingdom

[73] Assignee: The University of Manchester Institute of Science & Technology, Manchester, United Kingdom

[21] Appl. No.: 513,836

[22] PCT Filed: Mar. 2, 1994

[86] PCT No.: PCT/GB94/00406

§ 371 Date: Nov. 2, 1995

§ 102(e) Date: Nov. 2, 1995

[87] PCT Pub. No.: WO94/20990

PCT Pub. Date: Sep. 15, 1994

[30] Foreign Application Priority Data

Mar. 2, 1993 [GB] United Kingdom ............... 9304211

[51] Int. Cl.$^6$ .................. H01L 29/06; H01L 31/0328; H01L 31/0336
[52] U.S. Cl. .................. 257/17; 257/21; 257/22; 257/25; 257/97
[58] Field of Search .................. 257/21, 17, 22, 257/25, 97

[56] References Cited

U.S. PATENT DOCUMENTS

| | | | |
|---|---|---|---|
| 4,894,526 | 1/1990 | Bethea et al. | 257/15 X |
| 5,355,000 | 2/1993 | Delacourt et al. | 257/14 |

FOREIGN PATENT DOCUMENTS

| | | |
|---|---|---|
| 0380939A2 | 8/1990 | European Pat. Off. |
| 05027283 | 6/1993 | Japan . |

OTHER PUBLICATIONS

P. C. Harness et al., "Double–Barrier Resonant Tunneling Structures Incorporating Superlattice Energy Filters", Journal of Applied Physics, vol. 71, No. 6, American Institute of Physics, 15 Mar. 1992, pp. 3019–3024.

M. Büttiker et al., "Traversal Time for Tunneling", Physical Review Letters, vol. 49, No. 23, The American Physical Society, 6 Dec. 1982, pp. 1739–1742.

C. Sirtori et al., "Giant, Triply Resonant, Third–Order Nonlinear Susceptibility $\chi 3_\omega{}^{(3)}$ in Coupled Quantum Wells", Physical Review Letters, vol. 68, No. 7, The American Physical Society, 17 Feb. 1992, pp. 1010–1013.

K. Husimi et al., "Progress of Theoretical Physics", The Physical Society of Japan, vol. 9, Apr. 1953, pp. 381–402.

*Primary Examiner*—William Mintel
*Attorney, Agent, or Firm*—Skjerven, Morrill, MacPherson, Franklin & Friel, LLP

[57] ABSTRACT

A quantum well device has an active region adapted to pass a tunneling current of charge carriers and comprising layers of material forming alternating potential barriers and potential wells. The structure defines, in use, a first potential well at one end of the active region, said first potential well defining a first quasi-defined energy level, and to further define second and third quasi-defined energy levels. The relative heights and thicknesses of the potential barriers when the device is in use are structured so that the first quasi-defined energy level has a longer lifetime than the second and third quasi-defined energy levels and there is a degree of coupling between the three quasi-defined energy levels which is strongest between the second and third quasi-defined energy levels. The transmission coefficient through the active region shows a resonance peak at each of the energies of the three quasi-defined energy levels. The transmission peak at the energy of the first quasi-defined energy level is greater than the transmission peaks at the energies of the second and third quasi-defined energy levels, respectively, and when in use, the energy of the first quasi-defined energy level lies between the energies of the second and third quasi-defined energy levels but is greater or less than the average of the energies of the second and third quasi-defined energy levels.

18 Claims, 5 Drawing Sheets

MULTIPLE QUANTUM WELL DEVICE

CROSS REFERENCE TO RELATED APPLICATIONS

This document corresponds to International PCT Application PCT/GB94/00406.

The present invention relates to a quantum well device capable of operating over a range of frequencies including those corresponding to micrometer waves. For instance the device can be used to emit, amplify, modulate, detect and frequency multiply or divide micrometer radiation.

Micrometer radiation is electromagnetic radiation of wavelengths failing between infrared and millimeter wave radiation. Known sources of micrometer radiation include high temperature radiators, electron synchrotrons, backward wave oscillators and gas lasers. All of these known devices are inefficient and have low power densities and most of them are disadvantageously large and complex.

Gas lasers may be used to amplify micrometer radiation but are large, expensive and impractical for many applications. There are no other devices available for amplifying micrometer radiation.

Frequency multiplication of micrometer radiation can be carried out using Josephson junctions or non-linear dielectric materials but these known methods are inefficient.

There are a number of widely used solid state devices which operate at microwave frequencies, such as double barrier resonant tunnelling diodes, Gunn diodes and tunnel diodes, but none of these is capable of operating at micrometer wave frequencies. The high frequency working limit of such devices is limited by the properties of the materials used to fabricate the devices. Materials, i.e. semiconductors, are constantly being improved to extend this limit but it is generally accepted that existing solid state devices cannot be made to work at frequencies associated with micrometer radiation.

There are a number of important current, and potential, uses of micrometer radiation including: scientific research, particularly in the area of remote sensing and radio astronomy; instrumentation, including gas analysis; metrology, especially of voltage through the Josephson effect, of distance and of very short times; communications, including deep space communications and secure links; and radar systems, particularly with ultra compact antennas.

An object of the present invention is to provide a device which can operate at micrometer wavelengths and which obviates or mitigates the disadvantages of the known devices discussed above.

According to the present invention there is provided a quantum well device having an active region adapted in use to pass a tunnelling current of charge carriers, the active region comprising layers of material forming alternating potential barriers and potential wells arranged so as to define a first potential well at one end of the active region having regard to the direction of flow of the tunnelling current of charge carriers and a further structure, said first potential well defining a first quasi-defined energy level and the further structure defining second and third quasi-defined energy levels, the relative heights and thicknesses of the potential barriers when the device is in use being structured so that the first quasi-defined energy level has a longer lifetime than the second and third quasi-defined energy levels and there is a degree of coupling between the three quasi-defined energy levels which is strongest between the second and third quasi-defined energy levels, the arrangement being such that the transmission coefficient through the active region shows a resonance peak at each of the energies of the three quasi-defined energy levels, the transmission peak at the energy of the first quasi-defined energy level being greater than the transmission peaks at the energies of the second and third quasi-defined energy levels respectively, and the structure being such that when the device is in use the energy of the first quasi-defined energy level lies between the energies of the second and third quasi-defined energy levels but is greater or less than the average of the energies of the second and third energy levels.

In use the current of charge carriers through the device may be modulated by the application of a periodic disturbance, such as an a.c. field, to the device. As with prior art devices, such as double barrier resonant tunnelling devices, the degree of modulation will in general decrease as the frequency of the applied a.c. field increases towards the inverse of the lifetime of the quasi-defined energy level which is predominant in the transmission of charge carriers through the device under operating conditions, that is the first quasi-defined energy level referred to above. However, it can be shown, using theory discussed below, that the device according to the present invention exhibits the surprising result that, in contrast to prior art devices, the degree of modulation increases again (against the general trend of decreasing modulation) at certain modulation frequencies. That is, whenever the product of the modulation frequency, Planck's constant and any integer approaches the difference between the first quasi-defined energy level and the second and third quasi-defined energy levels the degree of modulation increases. This condition is hereinafter referred to as "the modulation condition".

Thus with the device according to the present invention the high frequency operating limit is determined by the relative energies of the three quasi-defined energy levels. The device can be readily constructed so that the energy level differences correspond to operating frequencies associated with micrometer wave radiation.

The precise characteristics of the high frequency behaviour of the device are determined by, in addition to the energies, the lifetimes and wave functions of the quasi-defined energy levels and the degree of coupling between them, and the maximum transmission coefficients of the resonances. Again the device can be readily constructed so that these parameters have the appropriate values for the desired behaviour of the device.

The underlying theory of the present invention is firmly based in, but extends, existing quantum mechanical theory. The following theory is discussed particularly in relation to semiconductor materials. However, the device according to the present invention need not be fabricated from semiconductor materials. For instance layers of metals and insulators could be used to define the required sequence of potential barriers and wells. The following theory can be readily applied to such alternative materials.

Quantum effects may be calculated using the solutions to Schrodinger's wave equation. In particular, if time dependent effects are to be investigated, such as effects due to the application of an a.c. field to a system, then the time dependent form of Schrodinger's equation is used.

It is known that in any semiconductor device there will be regions in which: (a) there is no electric charge; (b) there is a constant static electric charge; and (c) there is static electric field which varies linearly with distance. It can be shown (see for example the article "Miscellanea in Elementary Quantum Mechanics II" by Kodi Husimi, Progress of Theoretical Physics, Vol. 9, No. 4, p381) that there are exact solutions to the time dependent Schrodinger equation in each of these three regions respectively when considered in the presence of an alternating field which gives rise to a periodically varying potential. These exact solutions can be used to calculate the high frequency behaviour of solid state tunnelling devices (see for example the paper by Buttiker M. and Landauer R., 1982 Phys. Rev. Lett., 49, 1739).

A solid state tunnelling device consists of a number of regions separated by steps in the potential energy of charge carriers which tunnel through the device. An appropriate one of the above discussed exact solutions to Schrodinger's equation is used to describe the particle wave associated with a charge carrier within each respective region in the presence of an a.c. electric field.

The wave function, and its derivative, associated with each tunnelling charge carrier must be continuous at all times and at each of the boundaries between the regions. Because of the difference in the potential of adjacent regions, which gives rise to differences in the spatial dependence of the wave functions, the continuity equations can only be satisfied if there are additional waves with discreet energies $H \pm nh\nu$, where H is the energy of the wave function in question, h is Planck's constant, $\nu$ is the frequency of modulation and n is an integer. Effects linear in the a.c. electric field are described by waves for which $n=1$.

The degree by which a current of charge carriers is modulated is found by summing the components generated at the boundaries of each region and combining these with the transmitted particle wave. This calculation is repeated for all the energies for which charge carriers might enter the active region of the structure. The overall degree of modulation is found by summing the degree of modulation for each different energy weighted by the probability of a tunnelling charge carrier having that energy.

Using this established theory the tunnelling current through a single barrier device can be shown to be amplitude modulated by an a.c. field across the barrier. The degree of modulation increases with an increase in the modulating frequency of a constant amplitude a.c. field. However the effect is so small that such single barrier devices can not be used as practical sources of micrometer waves.

Applying the theory to a tunnelling current through a double barrier resonant tunnelling device shows that the degree of modulation decreases with increasing frequency. The maximum frequency at which a tunnelling current through the device can be modulated is approximately the inverse of the lifetime of the quasi-confined energy level in the potential well between the two barriers. There are practical limitations, resulting from the characteristics of known materials, to the extent to which the lifetime of the quasi-defined energy level can be reduced whilst maintaining a working device. It is generally accepted that even if further improvements can be made in the materials used to make these devices that it will not be possible to construct such a device to be operable at micrometer wavelengths.

The present invention represents a departure from known quantum well devices which makes use of previously unrealised quantum mechanical effects.

The magnitude of the tunnelling current which is passed by the device will depend upon the number of charge carriers leaving the active region from the final potential well defined by the active region. The inventor has shown that with an active region configured in accordance with the present invention, application of an a.c. field of a frequency approximately equal to that corresponding to the energy difference between the first quasi-defined energy level and either the second or third quasi-defined energy levels results in a previously unappreciated oscillation effect stemming from the coupling of the three energy levels. (A similar oscillation effect associated with confined triple well systems has been demonstrated by AT & T Bell Laboratories, Physical Review Letters, Vol. 68, No. 7, 17 Feb. 1992.) The result of this complex oscillation effect is the establishment of an oscillating electric dipole between the first and last wells with an associated increase in the modulation of the tunnelling current through the device.

The effect of an a.c. field on a device constructed in accordance with the present invention has been calculated using the theory discussed above and disclosed in the cited references.

In general the modulation of the tunnelling current in the region where the modulation condition holds will vary from a small negative conductance through a maximum negative conductance followed by a maximum positive conductance followed by a small positive conductance, or vice versa, as the modulation frequency varies. Under conditions of maximum negative or positive conductance the phase of the modulation of the current of charge carriers will be at 45° to the modulating field. Optimum phase and amplitude performance can be achieved by careful design of the active region of the device.

Preferably the first potential well is defined at the front end of the active region having regard to the direction of flow of the tunnelling current of charge carriers. This results in the greatest modulating effect on the tunnelling current in an applied alternating field.

Since the first quasi-defined energy level of the device has a greater lifetime than the other quasi-defined energy levels it is the dominant state in the transmission of charge carriers through the device and therefore has the greatest density of occupation by the charge carriers. The magnitude of the tunnelling current flowing out of the device will be dependent on the density of charge carriers in the final well in the active region. Under the application of an applied alternating field of appropriate frequency, i.e. corresponding to the modulation condition, the density of charge carriers in the final well will vary, the greater the variation the greater the modulating effect of the device. By positioning the dominant state at the front of the active region it will act as a reservoir supplying charge carriers to the rest of the structure, and in particular to the final well. This allows for a considerable variation in carrier density in the final well for a relatively small amplitude applied field. This has the effect of increasing the negative conductance of the device relative to the d.c. current that flows through the device.

In addition, positioning the first well, and thus the dominant transmission state, at the front of the active region ensures that changes in the energies of the other states relative to the dominant state associated with changing the bias on the structure correspond to a shift with little change in energy differences between the other states. This allows the structure to be brought to its optimum operating point by varying the bias on the structure thus providing for compensation for slight differences in structure between individual devices.

The width, in energy, of the transmission peak associated with the dominant state is narrower than those of the other states. Preferably the active region is constructed so that the width of the transmission peak associated with the first quasi-defined energy level is substantially smaller than the transmission peaks associated with the second and third quasi-defined energy levels respectively. This makes it possible to arrange that with the optimum applied bias the image of the transmission peak associated with the first quasi-defined energy level, i.e. the dominant state, when shifted up or down in energy by Plank constant multiplied by the modulation frequency, i.e. the frequency of the applied field, essentially spans only one side of the transmission peaks associated with the second and third quasi-defined energy levels. This minimises the degree of cancelation of the modulation effects between the different charge carrier energies in the dominant transmission state.

The said further structure of the active region of the device in accordance with the present invention may comprise second and third potential wells separated by a potential barrier thinner than the potential barriers which define the first potential well and thus the first quasi-defined energy level, the second and third potential wells defining the second and third quasi-defined energy levels respectively.

The splitting of the second and third quasi-defined energy levels under operating conditions is approximately equal to twice the fundamental frequency of the applied field at which the device will operate. Thus the operating frequency of the device can be determined by altering the height and width of the barrier separating the second and third potential wells.

The highest operating frequencies are achieved by dispensing with the barrier between the second and third potential wells to form a single well which can be structured to define the required two energy levels. That is the second and third quasi-defined energy levels may be defined by a single potential well.

The application of an alternating field to the device couples charge carriers in the first quasi-defined energy level to states higher and lower in energy, ie the second and third quasi-defined energy levels. Because there is simultaneous coupling to states with energies in the correct positions above and below the dominant state, the conductances associated with the second and third energy states will add and their susceptances will cancel. It is thus possible to arrange that the magnitude of the conductance of the device is maximum at a frequency at which the susceptance is equal to zero and the tunnelling current is in phase with the applied field. At the same time this ensures that the current associated with the displacement of carriers within the structure is purely reactive. These are clearly advantageous features.

For maximum effect it is desirable that the active region is structured so that the first quasi-defined energy level lies close to the average of the energies of the second and third energy levels and also that its transmission peak is substantially greater than the transmission peaks of the second and third quasi-defined energy levels.

For most foreseeable applications of the device the first quasi-defined energy level will have to lie above the average of the energies of the second and third quasi-defined energy levels. However it will be necessary for some applications, for instance to enable the device to be used as a modulator, to position the first quasi-defined energy level below the average of the other two so that the device displays a maximum positive conductance.

The further structure of the device may be constructed so as to define further pairs of energy levels lying above and below the second and third quasi-defined energy levels but having substantially the same average energy. This would, for instance, enable the device when used as a frequency multiplier to operate at much higher efficiencies than would otherwise be possible.

The further energy levels may each be defined by a respective potential well formed in the further structure of the active region. Alternatively each pair of further energy levels may be defined by a single respective potential well.

Preferably the device is provided with first semiconductor regions which are doped on either side of the active region having regard to the direction of flow of the tunnelling current, the composition and doping of said semiconductor regions being such as to provide a flow of charge carriers through the device when the device is in use. The said first semiconductor regions may, for example, be fabricated from n-type GaAs.

Preferably second regions of semiconductor material which are undoped are provided between first regions of semiconductor material and the active region of the device to prevent variations in the electric field at the edges of the first semiconductor regions from having a significant effect of the active region.

This is desirable because using existing doping techniques there will be non-uniform electric field at the edges of the doped semiconductor region resulting from the unpredictable distribution of dopants throughout the material. Such a non-uniform electric field would clearly have an undesirable effect on the structure and operation of the active region of the device.

Preferably a region of undoped or depleted semiconductor material is provided adjacent the back end of the active region having regard to the direction of flow of the tunnelling current through the device, to increase the tunnelling conductance of the device relative to the capacitance conductance of the active region.

Preferably the device is constructed so that the active region lies between regions of material the composition of which is such that the potential energy of the charge carriers at one side of the active region is raised with respect to the potential wells and the potential energy of the charge carriers at the other side of the active region is lowered with respect to the potential wells such that charge carriers only enter the active region via said one side and leave via said other side.

Preferably the active region of the device is fabricated from layers of semiconductor material, for example GaAlAs may be used to form the potential barriers and GaAs may be used to form the potential wells. Thus in accordance with the present invention there is provided a solid state device which may be operated at frequencies at which existing solid state devices cannot operate. In particular the device can be constructed to operate at frequencies associated with micrometer waves and does not suffer the disadvantages discussed above in association with existing devices which operate at these frequencies.

The required tunnelling current of charge carriers is preferably provided by applying a d.c. bias to the device but may be provided by alternative methods, e.g. a p-n junction could be used.

Specific embodiments of the present invention will now be described, by way of example, with reference to the accompanying drawings, in which.

Figure 1:
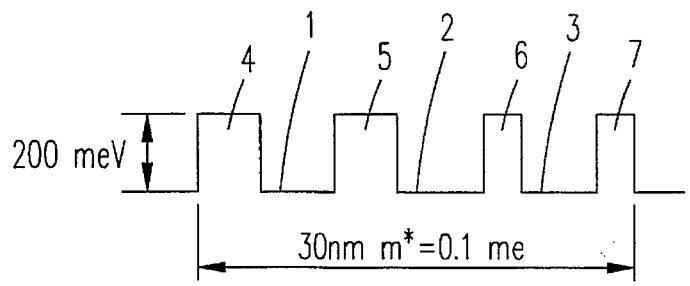
FIG. 1 is a schematic illustration of the active region of first device in accordance with the present invention.

Referring to FIG. 1, this schematically illustrates the active region of a first device in accordance with the present invention. The device comprises three sequential potential wells 1, 2 and 3, defined by potential barriers 4, 5, 6 and 7. The barriers all have the same height, that is 200 meV, but are not all of the same thickness. The barriers 4 and 5, which are of equal thickness, are thicker than barriers 6 and 7 which themselves are of equal thickness. The ratio of the thicknesses of the barriers 4 to 7 is 1.5:1.5:1:1. The wells 1 to 3 however each have the same width which is twice the thickness of the barriers 6 and 7. The overall length of the active region, from the rising edge of the first potential barrier 4 to the falling edge of the last potential barrier 7, is approximately 30 nm. The device is constructed to pass a tunnelling current of charge carriers which have an effective mass of 0.1 the mass of an electron.

FIG. 1 illustrates the configuration of the potential wells and barriers as they exist when the device is not in use. To function as desired the potential barriers and wells will have to remain substantially unaltered when the device is in use. Thus with such a structure a d.c. field cannot be applied to the device to provide the necessary tunnelling current as this would distort the configuration of the potential barriers and wells. In this case some other means of charge carrier injection must be employed, for instance a p-n junction could be used.

Because each of the wells has the same thickness the quasi-defined. energy levels that will be defined in the wells when the device is in use are nearly equal. However, because the potential barriers 4 and 5 are thicker than the potential barriers 6 and 7 the quasi-defined energy level in the first well, hereinafter referred to as a first quasi-defined energy level, has a greater lifetime than the quasi-defined energy levels in the second and third potential wells, hereinafter referred to as the second and third quasi-defined energy levels respectively. As a consequence of this there is a narrower distribution of energies for transmission through the first quasi-defined energy level than the second and third quasi-defined energy levels.

When the device is in use a degree of coupling will exist between the three quasi-defined energy levels. Because the potential barrier 6 which separates the potential wells 2 and 3 is thinner than the potential barrier 5, the potential wells 2 and 3 will be the most strongly coupled and will give rise to two quasi-defined energy levels whose energies are respectively higher and lower than the first quasi-defined energy level. The difference in the energies of these two states is determined by the degree of coupling between the wells 2 and 3 and hence the thickness and height of the potential barrier 6 which separates them. As mentioned above it is this difference in energy which determines the frequency of operation of the device. The degree of coupling between the potential wells 2 and 3 can readily be varied over a considerable range of energies simply by changing the characteristics of the potential barrier 6 and thus the operating frequency of the device can also be varied over a considerable range. In the limit the barrier 6 could be dispensed with altogether so that wells 2 and 3 are effectively replaced by a single well, in which case the dimensions of the single well must be such that the required two energy levels are defined within the well. In this case the separation of the second and third quasi-defined energy levels will be greatest and thus the operating frequency will be a maximum.

Figure 2:
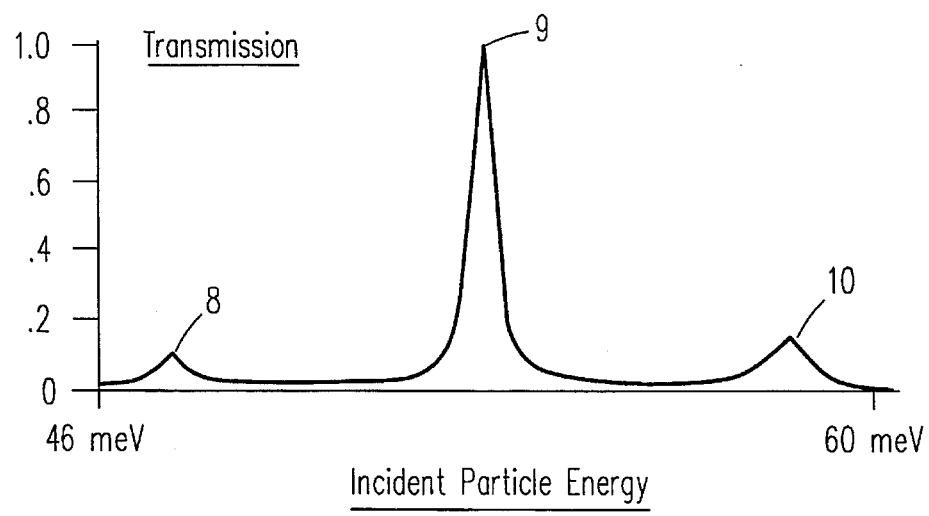
FIG. 2 is a plot of the transmission coefficient as a function of incident particle energy for a tunnelling current through the device of FIG. 1.

FIG. 2 shows, as a function of energy, the probability that any given particle arriving at the first potential barrier 4 will tunnel through the active region of the device and emerge from the last potential barrier 7. The three peaks 8, 9 and 10 in the transmission coefficient, i.e. the probability, are associated with the three different energy levels respectively.

The central transmission peak 9 is much higher than the transmission peaks 8 and 10 and is that associated with the first quasi-defined energy level. This peak falls at an energy slightly higher than the average of the energies of the transmission peaks 8 and 9 and has a significantly narrower width at half height. This represents the major channel for the transmission of a spectrum of particles with a broad range of energies through the device.

As explained above, the operation of the device is determined by the energies of the transmission peaks, their widths and their associated wave functions.

Figure 3:
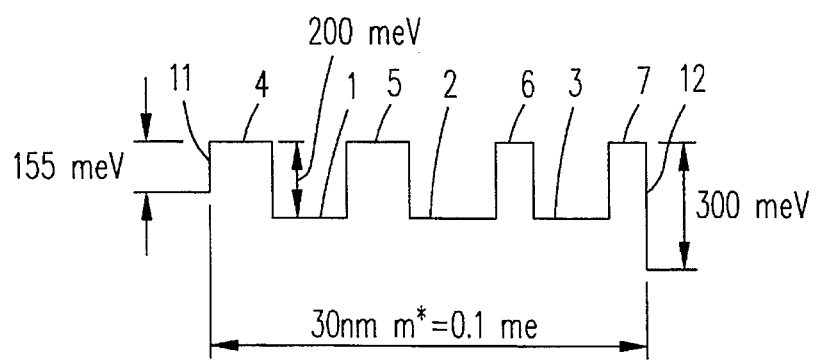
FIG. 3 is a schematic illustration of the active region of a second device in accordance with the present invention.

A device which is more practical than that illustrated in FIG. 1 is schematically illustrated in FIG. 3. This shows the configuration of the potential barriers and potential wells of a second device in accordance with the present invention in use with a d.c. field applied across the device to provide the necessary current of charge carriers. As in the case of the device illustrated in FIG. 1, the effective mass of the charge carriers is 0.1 of the mass of an electron. The device is substantially the same as that shown in FIG. 1 and thus like reference numerals will be used for like features.

The widths of the potential barriers and wells, and the depth of the wells, of the device shown in FIG. 3 are the same, in use, as those of the device shown in FIG. 1. However, the active region illustrated in FIG. 2 is bordered by semiconductor regions 11 and 12 the composition and doping of which is such that charge carriers in the semi conductor region 8 which borders the potential barrier 4 have a higher potential than the charge carriers within the wells 1, 2 and 3 and the charge carriers in the semiconductor region 9 bordering potential barrier 7 is lower than the potential energy of the charge carriers in the wells 1, 2 and 3. More specifically, the potential wells have a depth of 200 meV, whereas the potential deference between the top of the barriers 4 and 7 and the semiconductors regions 8 and 9 is 155 meV and 300 meV respectively. This configuration ensures that there will be a significant flux of charge carriers incident into the device through the potential barrier 4, and no charge carriers incident into the device through the potential barrier 7. This therefore dictates the direction in which the charge carriers will flow through the device.

Figure 4:
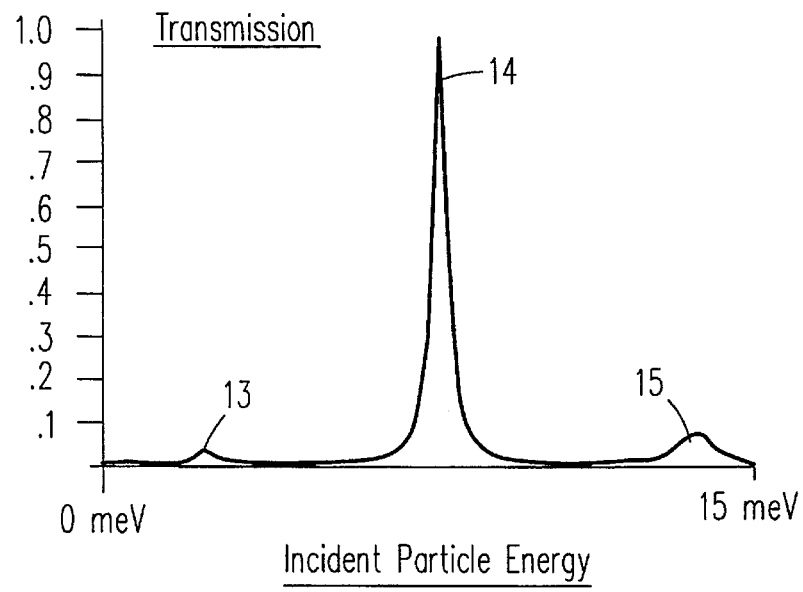
FIG. 4 shows a plot of the transmission coefficient as a function of incident particle energy for a tunnelling current through the device shown in FIG. 3.

As can be seen from FIG. 4, which shows a plot of the transmission coefficient as a function of energy for the device illustrated in FIG. 3, the pattern of transmission peaks is not significantly affected by raising the potential in the region 8 and lowering the potential in the region 9 relative to the depth of the potential wells. The transmission is still dominated by the peak associated with the first quasi-defined energy level. The only notable difference is that the lowest energy peak 11 is reduced in amplitude relative to the other two transmission peaks 12 and 13.

Figure 5:
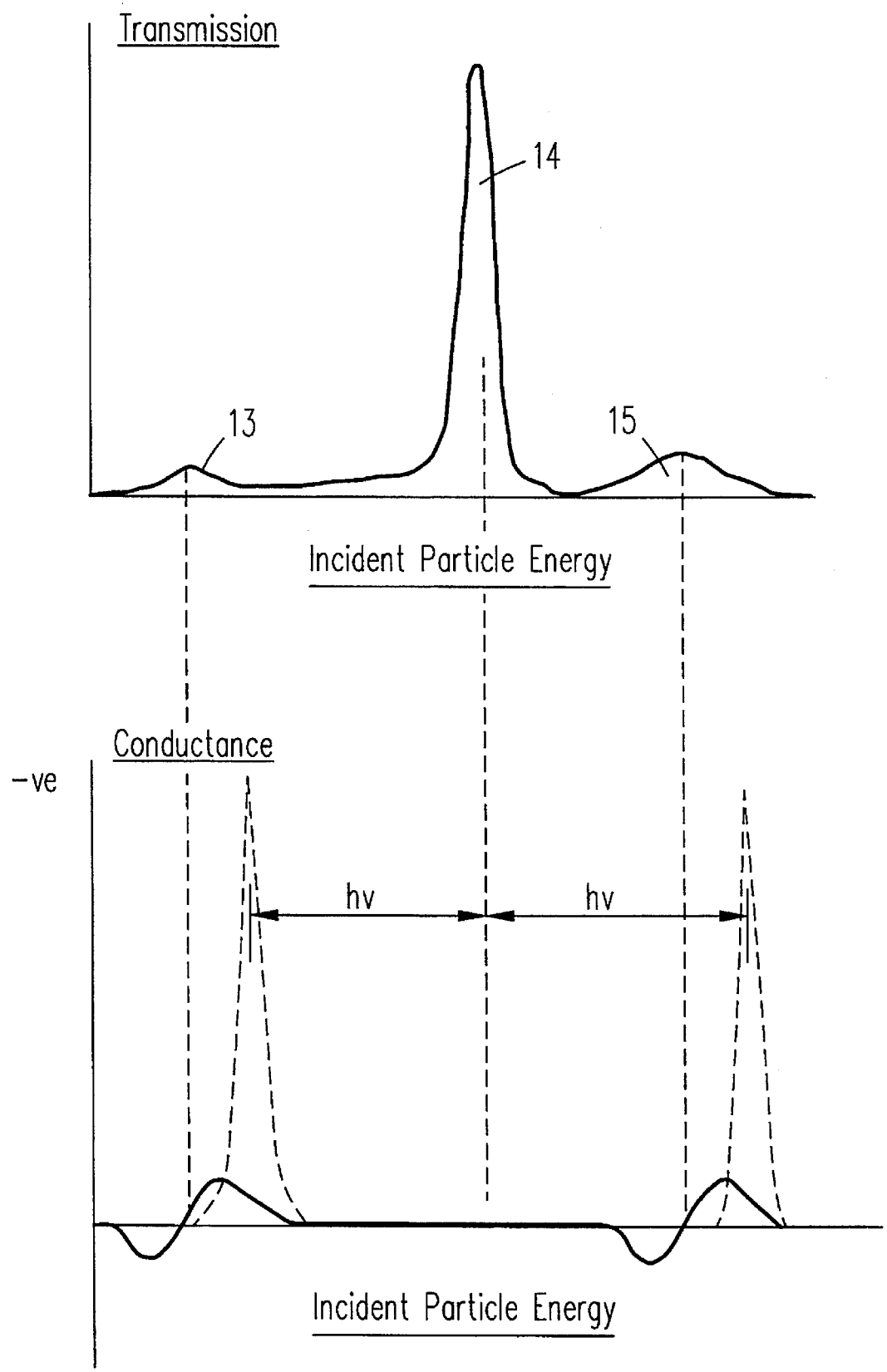
FIG. 5 shows plots of both the transmission coefficient and the negative conductance function, as a function of energy, for the device shown in FOG. 3 and illustrates the effect of applying an a.c. field to the device.

FIG. 5 illustrates the effect of applying an a.c. field to the device of FIG. 3 in the presence of a small positive d.c. bias, the arrangement being such that the dominant transmission peak 14 lies just above the average of the energies of the peaks 13 and 15. On application of an a.c. field of frequency v corresponding approximately to the difference in energy between the peak 14 and the peaks 13 and 15 respectively, i.e. the modulation condition referred to above, images of the dominant peak 14 are produced shifted up and down in energy by an amount equal to v multiplied by Planck's constant. As can be seen from FIG. 4, because the peak 14 initially (i.e. when unshifted by the a.c. field) lies above the average of the energies of the peaks 13 and 15, the image of the shifted peak 14 lies on the same side of the peaks of the negative conductance functions associated with the transmission peaks 13 and 15 respectively and therefore the device exhibits a resultant negative resistance characteristic. It will be apparent that the convolution of the electron transmission coefficient with the negative conductance function is greatest when the central peak is narrow and the shift is arranged to place the "image" peaks on the maxima of the negative conduction function.

Similarly, if the device is constructed or arranged in operation so that the dominant peak 14, in the absence of an applied a.c. field, lies below the average of the energies of the peaks 13 and 15 then the applied a.c. field will shift the dominant peak 14 so as to produce a maximum positive conductance effect.

The importance of ensuring that the dominant peak 14 lies either above or below the average of the energies of the peaks 13 and 15 will thus be evident. If the energy of the peak 14 is exactly equal to the average of the energies of the peaks 13 and 15 the effect of shifting the peak 14 upwards or downwards in energy will be nil since the effect of the more energetic carriers in the peak is cancelled by the effect of the less energetic carriers. Thus there will be no significant resultant positive or negative conductance effect.

Figure 6:
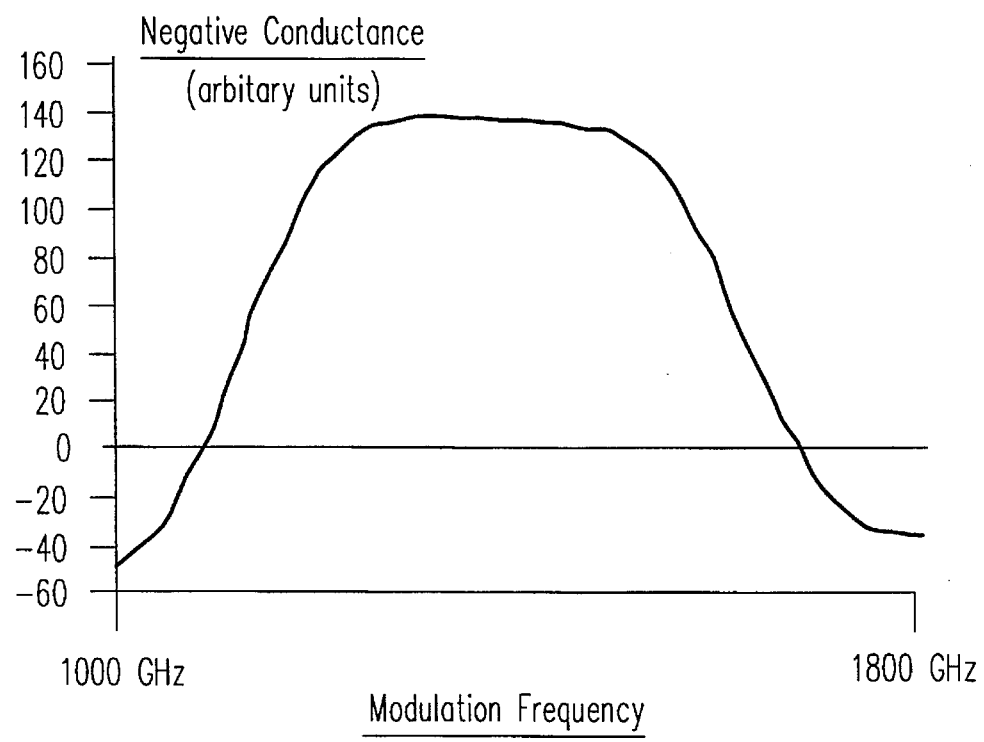
FIGS. 6 to 8 show plots of the negative conduction of a device shown in FIG. 3 as a function of modulation frequency in the presence of three different d.c. biasing fields respectively.

The negative conductance as a function of modulation frequency for the device shown in FIG. 3 is illustrated in FIG. 6. The curve is calculated using the theory discussed above. The data illustrated in FIG. 6 shows the degree of modulation of a tunnelling current 180° out of phase with the modulating field and with an d.c. bias of 4.4 mV across the active region. The spectrum of incident particles was taken from a Maxwell-Boltzmann distribution with a temperature of 80 K. As can be seen from FIG. 6 the device exhibits a negative conductance over a significant range of frequencies in the micrometer range.

Figure 7:
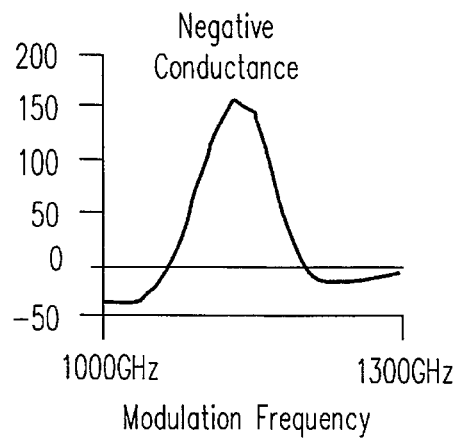
Figure 8:
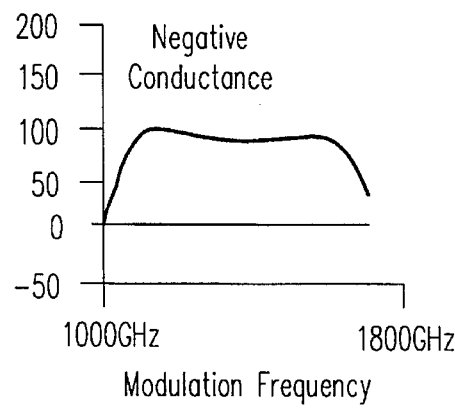

The curves shown in FIGS. 7 and 8 correspond to that shown in FIG. 6 but with d.c. biasing fields of 2.2 mV and 6.6 mV respectively instead of the 4.4 mV biasing field applied in the case of FIG. 6. As can be seen from FIGS. 7 and 8 the negative resistance characteristic of the device is not eliminated by small changes in the d.c. voltage applied across the device and also that it is possible to optimise the operation of the device by a variation of the bias field. There is thus a significant scope for variation in the detailed structure whilst maintaining the desired negative conductance characteristic.

Figure 9:
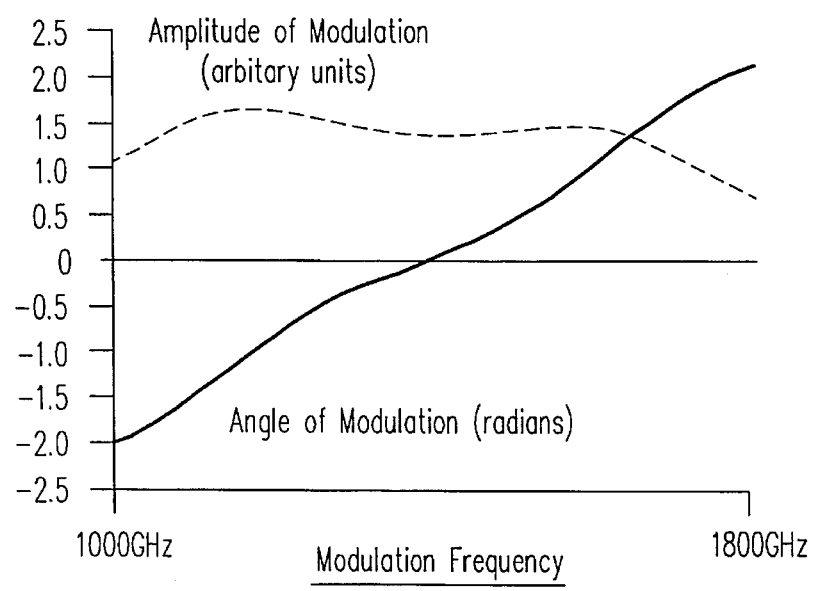
FIG. 9 is a plot of the amplitude and angle of the modulation of the tunnelling current through the device of FIG. 3 as a function of frequency.
Figure 10:
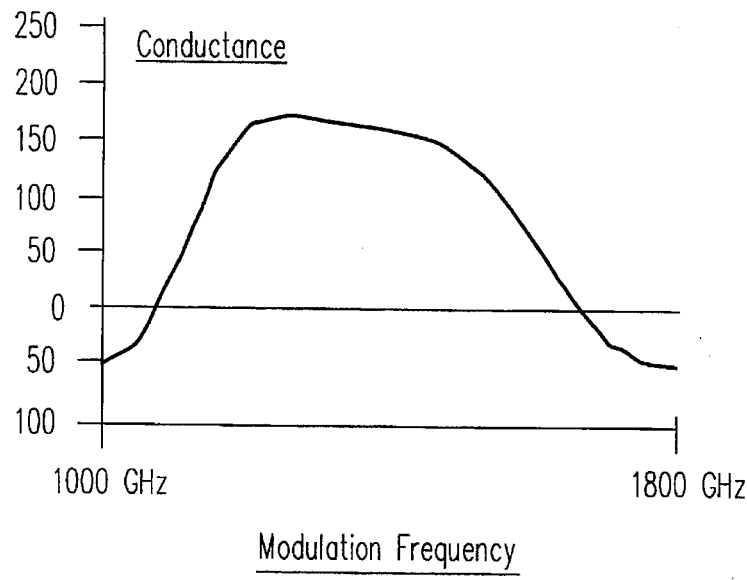
FIG. 10 is a plot showing that the conductance of the device of FIG. 3 as a function of modulation frequency with a d.c. bias in the opposite sense to that of FIGS. 6, 7 and 8.

FIG. 9, which shows the amplitude and angle of the modulation of the tunnelling current through the device of FIG. 3 as a function of frequency, presents data from the same calculation as in FIG. 6 but presented in an alternative manner. An angle of 0 degrees represents pure negative resistance. From FIG. 9 it will be seen that it is possible to construct the device so as to have the current modulation at its peak and in phase with the modulating field at the same modulating frequency.

The curve shown in FIG. 9 corresponds with that shown in FIGS. 6, 7 and 8 but in the presence of a d.c. biassing field of −2.2 mV which shifts the central resonance peak 14 below the average of the energies of the peaks 13 and 15. This shows that it is possible for the device to be constructed so as to exhibit a maximum positive conductance as well as a maximum negative conductance at frequencies corresponding to micrometer radiation. This feature extends the possible applications to which the device can be put, for instance this maximum positive conductance characteristic enables the device to be used as a modulator.

The devices described above and illustrated schematically in FIGS. 1 and 3 exhibit enhanced modulation of the tunnelling current in the frequency range corresponding to micrometer radiation. The conductance may be either positive or negative depending on the direction of the bias field applied to the device. These properties are dependent upon the energies of the quasi-defined energy levels present in the potential wells and the degree of coupling between them. The detailed structure of the device may be modified, i.e. by changing the barrier heights and the widths of the barriers and wells, without significantly affecting the modulation characteristics so long as the energies of the quasi-defined energy levels and the degree of coupling between them remain substantially the same.

The operational frequency of the device within the micrometer range can readily be varied by varying the degree of coupling between the energy levels with appropriate modifications of the structure of the potential barriers. The maximum operating frequency is limited by the maximum separation of the second and third quasi-defined energy levels which is achieved by dispensing with the barrier separating the second and third wells so as to form a single well with two strongly coupled energy levels, and by the maximum barrier height which is dependent upon the material from which the barrier is constructed. The minimum operating frequency will depend upon the temperature at which the device is constructed to operate and the degree of control with which the device can be fabricated. The practical limit using current technology is approximately 500 GHz, but there is no theoretical lower limit.

The large negative conductive exhibited by the device can be used in various ways to produce practical power sources. A single device, or a number of devices arranged in parallel, could be coupled electromagnetically to a resonance structure (for example a dipole, a wave guide cavity or a transmission line resonator) arranged so that the resonator provides a modulating field across the device and thus power is extracted from the modulating field by virtue of the negative resistance characteristic.

Two devices might be connected in series with one biased so as to exhibit negative conductance and the other biassed to exhibit a smaller positive conductance. Such an arrangement will be unstable and oscillate at a frequency in the micrometer range. The alternating electric and magnetic fields associated with such an arrangement may be coupled to an external system or directly to free space.

The basic structure of FIG. 3 will exhibit, in addition to the conductance associated with the modulation of the tunnelling current, admittances associated with the capacitance between terminals which in use will be connected on either side of the active region and with the displacement of the charge carriers between the wells within the device structure. The latter will be inductive when the structure is operating in the negative conductance mode. The relative importance of the tunnelling conductance compared with the capacitance conductances may be increased by adding a region of undoped or depleted semiconductor to the right of the structure shown in FIG. 3. The thickness of this region is limited by the velocity of the charge carriers and the operating frequency.

The negative conductance can also be used to amplify micrometer radiation. This can be achieved by coupling a device according to the present invention electromagnetically to a bidirectional or unidirectional propagating structure, for example a waveguide incorporating some polarised magnetic material or optically active material. Using this system it would be possible for the device to increase the power of a propagating wave as it passed along the structure thereby amplifying it.

The response of the device shown in FIG. 3 to applied fields is so large that significant non-linear effects will be exhibited with voltages across the device as small as 0.2 mV, corresponding to electric fields of the order of $5 \times 10^3$ V/m. This non-linearity may be used in a detector to detect the presence of micrometer radiation by a change in the d.c. current through the device at constant bias. Such a detector would normally be used in conjunction with a resonant structure to which the device is coupled in order to increase the sensitivity of detection and to provide some frequency selectivity.

The large non-linear response can be used to achieve frequency multiplication in structures similar to that of FIG. 3 but structured to define more than 3 quasi-defined energy levels. For instance, a structure with 5 wells producing two quasi-defined energy levels above and below the dominant state will provide a strong second harmonic generation and may exhibit power gain if the structure of the device is fully optimised.

The device shown in FIG. 3 can be readily be used as the emitter in a three terminal device similar to a transistor. In such a device the current associated with the capacitance part of the device conductance and the transport part of the device conductance would appear at separate terminals. In this case it would not be necessary to use the negative conductance characteristic of the structure to produce power gain. A three terminal device might be easier to incorporate into certain designs of amplifiers and oscillators.

It will be appreciated that devices constructed in accordance with the present invention may be used in different applications to those described above. That is a device having the essential characteristics of the present invention and therefore being operable at micrometer wavelengths has many potential applications of which those described above are non-exhaustive examples.

Figure 11:
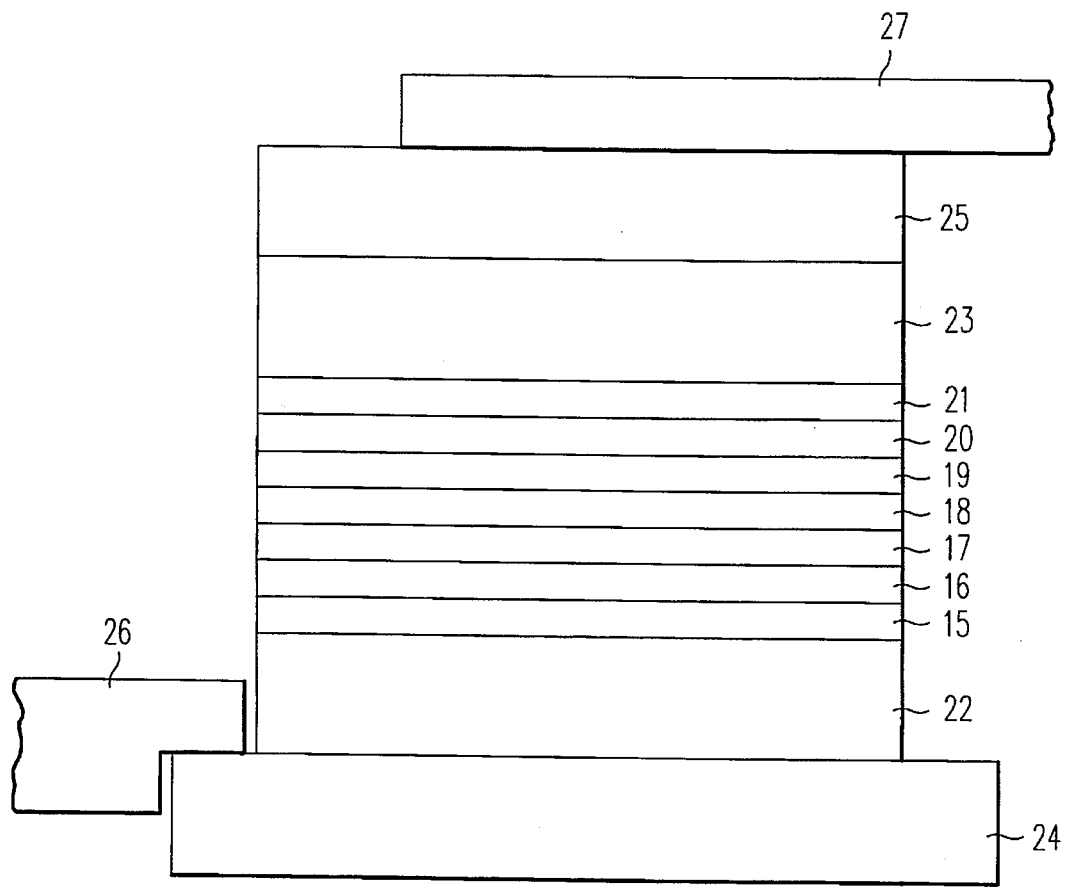
FIG. 11 illustrates one embodiment of a device in accordance with the present invention.

As mentioned above, a variety of materials may be used to fabricate a device in accordance with the present invention so long as the required potential barriers and potential wells are formed. FIG. 11 illustrates schematically a device in accordance with the present invention having an active region fabricated from semiconductor materials.

Referring to FIG. 11 the illustrated device comprises an active region fabricated from alternating layers 15 to 21 of $Ga_{0.7}Al_{0.3}As$ and GaAs. Layers 15, 17, 19 and 21 are composed of $Ga_{0.7}Al_{0.3}As$ and form the required potential barriers, and layers 16, 18 and 20 are composed of GaAs and form the potential wells. The thicknesses of the layers 15 to 21 are respectively: 18 Å; 60 Å; 15 Å; 65 Å; 25 Å; 70 Å; and 25 Å. Each of the layers in the active region is undoped.

The active region is bounded on each side by 0.3 micrometer thick layers of undoped GaAs, 22 and 23 respectively. The GaAs layers 22 and 23 are themselves bounded by layers of n-type doped GaAs 24 and 25 which have a doping density of $10^{18} cm^{-3}$. Electrical terminals 26 and 27 are connected to the layers of GaAs 24 and 25 respectively.

The layers 24 and 25 of n-type doped GaAs provide the charge carriers for the tunnelling current through the device. The purpose of the undoped layers 22 and 23 is to space the active region from the doped layers 24 and 25 to prevent the non-uniform electric field which will be present at the edges of the doped layers 24 and 25 (using currently available doping techniques it is not possible to precisely locate the dopants so as to prevent the formation of this field) from affecting the operation of the active region. It will be appreciated that the spacer layers 22 and 23 may not be necessary if some other source of charge carriers is used, or if the doping of the layers 24 and 25 can be more carefully controlled.

The device as shown in FIG. 11 may be readily fabricated using existing methods of semiconductor device manufacture. The device will exhibit the characteristics discussed above in relation to FIGS. 3 to 10, but will have a different operating frequency. As mentioned above the device may be used in a number of ways depending on the nature of the external circuitry the device is used in conjunction with.

The present invention therefore provides a new type of quantum well device, which in particular can be readily fabricated from existing semiconductor materials, which can perform a whole range of possible functions within a frequency range, particularly those frequencies associated with micrometer radiation, within which existing solid state devices can not operate.

I claim:

1. A quantum well device having an active region adapted in use to pass a tunnelling current of charge carriers, the active region comprising layers of material forming alternating potential barriers and potential wells arranged so as to define a first potential well at one end of the active region having regard to the direction of flow of the tunnelling current and a further structure comprising at least a second potential well, said first potential well defining a first quasi-defined energy level and the further structure defining second and third quasi-defined energy levels, the relative heights and thicknesses of the potential barriers when the device is in use being structured so that the first quasi-defined energy level has a longer lifetime than the second and third quasi-defined energy levels and there is a degree of coupling between the three quasi-defined energy levels which is strongest between the second and third quasi-defined energy levels, the arrangement being such that the transmission coefficient through the active region shows a resonance peak at each of the energies of the three quasi-defined energy levels, the first resonance peak at the energy of the first quasi-defined energy level being greater than the second and third resonance peaks at the energies of the second and third quasi-defined energy levels respectively, and that when the tunneling current is flowing the energy of the first quasi-defined energy level lies between the energies of the second and third quasi-defined energy levels but is one of greater and less than an average of the energies of the second and third energy levels, and such that on application of an A.C. field to the device an alternating current will flow which increases when the frequency of the applied A.C. field corresponds to an energy difference between the first quasi-defined energy levels as a result of a coupling between the first resonance peak and both the second and third resonance peaks.

2. A quantum well device according to claim 1, wherein the first potential well is defined at a front end of the active region having regard to the direction of flow of the tunnelling current.

3. A quantum well device according to claim 1, wherein the second and third quasi-defined energy levels are defined by a single potential well.

4. A quantum well device according to claim 1, wherein the further structure comprises second and third potential wells separated by a potential barrier thinner than those which define the first quasi-defined energy level, the second and third potential wells defining the second and third quasi-defined energy levels respectively.

5. A quantum well device according to claim 3, wherein the further structure defines fourth and fifth quasi-defined energy levels having a greater separation in energy than the second and third quasi-defined energy levels but substantially the same average energy.

6. A quantum well device according to claim 5, wherein the further structure comprises fourth and fifth potential wells which define the fourth and fifth quasi-defined energy levels respectively.

7. A quantum well device according to claim 5, wherein the fourth and fifth quasi-defined energy levels are defined by a single potential well.

8. A quantum well-device according to claim 3, wherein the further structure defines additional pairs of energy levels of successively greater separation in energy but having substantially the same average energy.

9. A quantum well device according to claim 1, wherein first semiconductor regions which are doped are provided on either side of the active region having regard to the direction of flow of the tunnelling current, the composition and doping of said semiconductor regions being such as to provide a flow of charge carriers through the device when the device is in use.

10. A quantum well device according to claim 9, wherein the said first semiconductor regions are fabricated from n-type GaAs.

11. A quantum well device according to claim 9, wherein second regions of semiconductor material which are undoped are provided between said first regions of semiconductor material and the active region of the device to prevent variations in the electric field at the edges of the first semiconductor regions from having a significant effect of the active region.

12. A quantum well device according to claim 1, wherein a region of undoped or depleted semiconductor material is provided adjacent the back end of the active region having regard to the direction of flow of the tunnelling current through the device, whereby tunnelling conductance of the device is increased relative to capacitance conductance of the active region.

13. A quantum well device according to claim 1, wherein the active region is constructed so that the half height width of the transmission peak associated with the first quasi-defined energy level is substantially smaller than the half height width of the transmission peaks associated with the second and third quasi-defined energy levels respectively.

14. A quantum well device according to claim 1, wherein the active region is constructed so that the energies of the first, second and third quasi-defined energy levels are nearly equal.

15. A quantum well device according to claim 1, wherein the active region lies between regions of material the composition of which is such that the potential energy of the charge carriers at one side of the active region is raised with respect to the potential wells and the potential energy of the charge carriers at the other side of the active region is lowered with respect to the potential wells such that charge carriers only enter the active region via said one side and leave via said other side.

16. A quantum well device according to claim 1, wherein the energy of the first quasi-defined energy level is nearly the same as an average of the energies of the second and third quasi-defined energy levels.

17. A quantum well device according to claim 1, wherein the active region is fabricated from layers of semiconductor material.

18. A quantum well device according to claim 17, wherein the potential barriers are formed by layers of GaAlAs and the potential wells are formed by layers of GaAs.

* * * * *